United States Patent
Kojo et al.

[11] Patent Number: 5,968,878
[45] Date of Patent: Oct. 19, 1999

[54] OXIDE SUPERCONDUCTOR AND METHOD OF PRODUCING SAME

[75] Inventors: Hiroki Kojo, Tochigi-ken; Sang-Im Yoo, Kokubunji; Masato Murakami, Tokyo, all of Japan

[73] Assignees: International Superconductivity Technology Center; Railway Technical Research Institute, both of Japan

[21] Appl. No.: 09/032,027

[22] Filed: Feb. 27, 1998

[30] Foreign Application Priority Data

Feb. 28, 1997 [JP] Japan ................... 9-046607

[51] Int. Cl.[6] .................... C04B 35/64; C04B 35/653
[52] U.S. Cl. .................... 505/450; 505/451; 505/729; 505/500
[58] Field of Search .................... 505/125, 126, 505/778, 785, 450, 451, 500, 729

[56] References Cited

U.S. PATENT DOCUMENTS 5,084,436 1/1992 Morimoto et al. .................... 505/1
5,525,584 6/1996 Murakami et al. .................... 505/450

FOREIGN PATENT DOCUMENTS 5-279033 10/1993 Japan .
5-279034 10/1993 Japan .

*Primary Examiner*—Mark Kopec
*Attorney, Agent, or Firm*—Lorusso & Loud

[57] ABSTRACT

A high critical temperature and high critical current density superconductor containing a matrix phase of a metal oxide expressed by the formula $RE^1Ba_2Cu_3O_p$ wherein $RE^1$ stands for La, Nd, Sm, Eu or Gd and p is a number of 6.8–7.2, a first dispersed phase of a metal oxide expressed by the formula $RE^2_{1+d}Ba_{2-d}Cu_3O_q$ wherein $RE^2$ stands for La, Nd, Sm, Eu or Gd, d is a number of 0<d<0.5 and q is a number of 6.0–7.2 and a second dispersed phase of a metal oxide expressed by the formula $RE^3_{4-2x}Ba_{2+2x}Cu_{2-x}O_{10-y}$ wherein RE stands for La or Nd, x is a number of 0<x ≤0.25 and y is a number of 0<y<0.5. The first and second phases are dispersed in the matrix. The above superconductor may be prepared by cooling a partial melt having a temperature of 1,000°–1,300° C. and containing a major molar amount of $RE^1Ba_2Cu_3O_p$ and a minor molar amount of $RE^3_{4-2x}Ba_{2+2x}Cu_{2-x}O_{10-y}$ at a cooling rate of 10° C./hour or less.

5 Claims, 3 Drawing Sheets

OXIDE SUPERCONDUCTOR AND METHOD OF PRODUCING SAME

BACKGROUND OF THE INVENTION

This invention relates to a superconductor having a high critical temperature and a high critical electrical current and to a method of producing same.

Recent development of a melt processing technique has enabled the production of excellent superconductors. One such melt processing technique is a melt-powder-melt-growth (MPMG) process by which a superconductor containing a $Y_2BaCuO_5$ (Y211) phase dispersed in a $YBa_2Cu_3O_y$ (Y123) phase and having a high critical electrical current can be obtained ("Melt Processed High Temperature Superconductor", M. Murakami, World Scientific, 1993). Such a superconductor can create a large electromagnetic force upon interaction with a magnetic field and can be utilizable for bearings, flywheels, transporting devices, etc.

Another known melt processing technique is a process in which a large crystal, such as of Y123, having controlled crystal orientation is grown using a seed crystal such as of La123, Nd123 or Sm123. A large crystal with controlled crystal orientation is desirable for applications to magnetic shields and permanent magnets.

Known RE123 (RE: rare earth element) superconductors have a serious problem that part of the Ba site is substituted by RE ion which has a large ionic radius so that the critical temperature is lowered (H. Ywe et al, Physica C, vol. 153–155, p. 930–931 (1988)).

U.S. Pat. No. 5,525,584 discloses a process for the production of a metal oxide superconductor having the formula $(R^1_{1-x}Ba_x)Ba_2Cu_3O_d$ (where $R^1$ is an element selected from La, Nd, Sm, Eu and Gd and d is a number between 6.2 and 7.2), wherein a melt having a temperature of 1,000–1,300° C. and containing $R^1$, Ba, Cu and O in such amounts that the content of $R^1$ is 0.3–0.6 mole, the content of Ba is 0.6–0.8 mole and the content of O is 2.1–2.7 moles each per mole of Cu is cooled at a cooling rate of 5° C./hour or less under a partial pressure of oxygen of between 0.00001 and 0.05 atm.

While this method can give a metal oxide superconductor having a critical temperature of 90K or more, there is a problem because it is necessary to strictly control the oxygen partial pressure and because the crystal growth velocity is so slow that the production cost is highly increased.

SUMMARY OF THE INVENTION

It is, therefore, an object of the present invention to provide a metal oxide superconductor which has a high superconducting critical temperature and exhibits a high critical current not only under a high magnetic field but also under a low magnetic field.

Another object of the present invention is to provide a superconductor having a superconducting critical temperature of at least 90 K and having high mechanical strengths.

It is a further object of the present invention to provide a process which can produce a superconductor of the above-mentioned type under an oxygen partial pressure of 0.1 atm or more.

It is yet a further object of the present invention to provide a process which permits the production of a superconductor having a desired shape.

In accomplishing the foregoing objects, the present invention provides a superconductor comprising:

a matrix phase of a metal oxide expressed by the following formula (I):

$$RE^1Ba_2Cu_3O_p \quad \text{(I)}$$

wherein $RE^1$ stands for at least one element selected from the group consisting of La, Nd, Sm, Eu and Gd and p is a number between 6.8 and 7.2, a first dispersed phase of a metal oxide expressed by the following formula (II):

$$RE^2_{1+d}Ba_{2-d}Cu_3O_q \quad \text{(II)}$$

wherein $RE^2$ stands for at least one element selected from the group consisting of La, Nd, Sm, Eu and Gd, d is a number greater than 0 but smaller than 0.5 and q is a number between 6.0 and 7.2, and a second dispersed phase of a metal oxide expressed by the following formula (III):

$$RE^3_{4-2x}Ba_{2+2x}Cu_{2-x}O_{10-y} \quad \text{(III)}$$

wherein $RE^3$ stands for at least one element selected from the group consisting of La and Nd, x is a number greater than 0 but not greater than 0.25 and y is a number greater than 0 but smaller than 0.5, each of said first and second dispersed phases being dispersed in said matrix phase.

In another aspect, the present invention provides a process for the production of a superconductor, comprising cooling a mixture having a temperature of 1,000°–1,300° C. and containing a major molar amount of $RE^1Ba_2Cu_3O_p$ wherein $RE^1$ stands for at least one element selected from the group consisting of La, Nd, Sm, Eu and Gd and p is a number between 6.8 and 7.2 and a minor molar amount of $RE^3_{4-2x}Ba_{2+2x}Cu_{2-x}O_{10-y}$ wherein $RE^3$ stands for at least one element selected from the group consisting of La and Nd, x is a number greater than 0 but not greater than 0.25 and y is a number not smaller than 0 but smaller than 0.5 at a cooling rate of 10° C./hour or less, thereby to form a superconducting phase.

FIG. 1 illustrates a ternary phase diagram of a $RE_2O_3$—BaO—CuO system, in which RE represents a rare earth element having a large ionic radius such as La, Nd, Sm, Eu or Gd. Because a $RE_{1+d}Ba_{2-d}Cu_3O_q$ (x>0, 6.8<y<7.2) phase formed as a result of the substitution of RE for a part of the Ba sites of a RE123 phase is as stable as the RE123 phase in air, a solid solution region as shown by the line P in FIG. 1 exists. In such a solid solution phase, the carrier concentration is reduced by the substitution of the trivalent RE ion for the divalent Ba ion to cause the lowering of the critical temperature. The range of the solid solution varies with the kind of RE.

The above-mentioned U.S. Pat. No. 5,525,584 teaches that when a RE—Ba—Cu—O superconductor is produced from a melt while maintaining the oxygen partial pressure in a range of 0.00001–0.05 atm, substitution of RE for part of Ba site is prevented and the resulting superconductor has a high critical temperature. Under an oxygen partial pressure of 0.1 atm or more, however, the RE rich $RE_{1+d}Ba_{2-d}Cu_3O_q$ phase is formed, resulting in the lowering of Tc.

It has now been found that when Ba rich $RE^3_{4-2x}Ba_{2+2x}Cu_{2-x}O_{10-y}$ (hereinafter referred to as Ba rich RE422) is used as part of the raw material, substitution of Ba with RE can be significantly prevented so that a RE—Ba—Cu—O superconductor having a high critical temperature can be obtained even when the oxygen partial pressure is 0.1 atm or more. More particularly, when such a Ba rich RE422 is used as part of the raw material, a RE123 phase having excellent superconducting characteristics is selectively solidified from a partial melt of the raw material (including a liquid phase of RE123 and a solid phase of Ba rich RE422) along the tie line A in FIG. 1.

It has also been found that a $RE_{1+d}Ba_{2-d}Cu_3O_q$ (hereinafter referred to as RE rich RE123) phase is also formed and dispersed in a matrix of the RE123 phase together with a Ba rich RE422 dispersed phase. These dispersed RE rich RE123 and Ba rich RE422 phases give such a pinning effect that the superconductor shows a high critical current throughout a wide range from low to high magnetic fields.

The dispersed regions show characteristics, such as critical temperature and critical current, different from those of the matrix. In particular, the superconductivity is destroyed under a strong magnetic field to cause transition into the normal conductivity. Since the intensity of the magnetic field which causes the normal conductivity transition varies with the composition of the dispersed regions, these dispersed regions can function as pinning centers in a wide range of the magnetic field.

As a consequence of the presence of the dispersed phases with various compositions, the Nd—Ba—Cu—O superconductor according to the present invention gives a high irreversibility field. Since the maximum magnetic field above which a superconductor is not actually usable is determined by the irreversibility field thereof, the high irreversibility field attained in the Nd—Ba—Cu—O superconductor has a great significance.

BRIEF DESCRIPTION OF THE DRAWINGS

Other objects, features and advantages of the present invention will become apparent from the detailed description of the preferred embodiments of the invention which follows, when considered in light of the accompanying drawings, in which.

DETAILED DESCRIPTION OF THE PREFERRED EMBODIMENTS OF THE INVENTION

Figure 1:
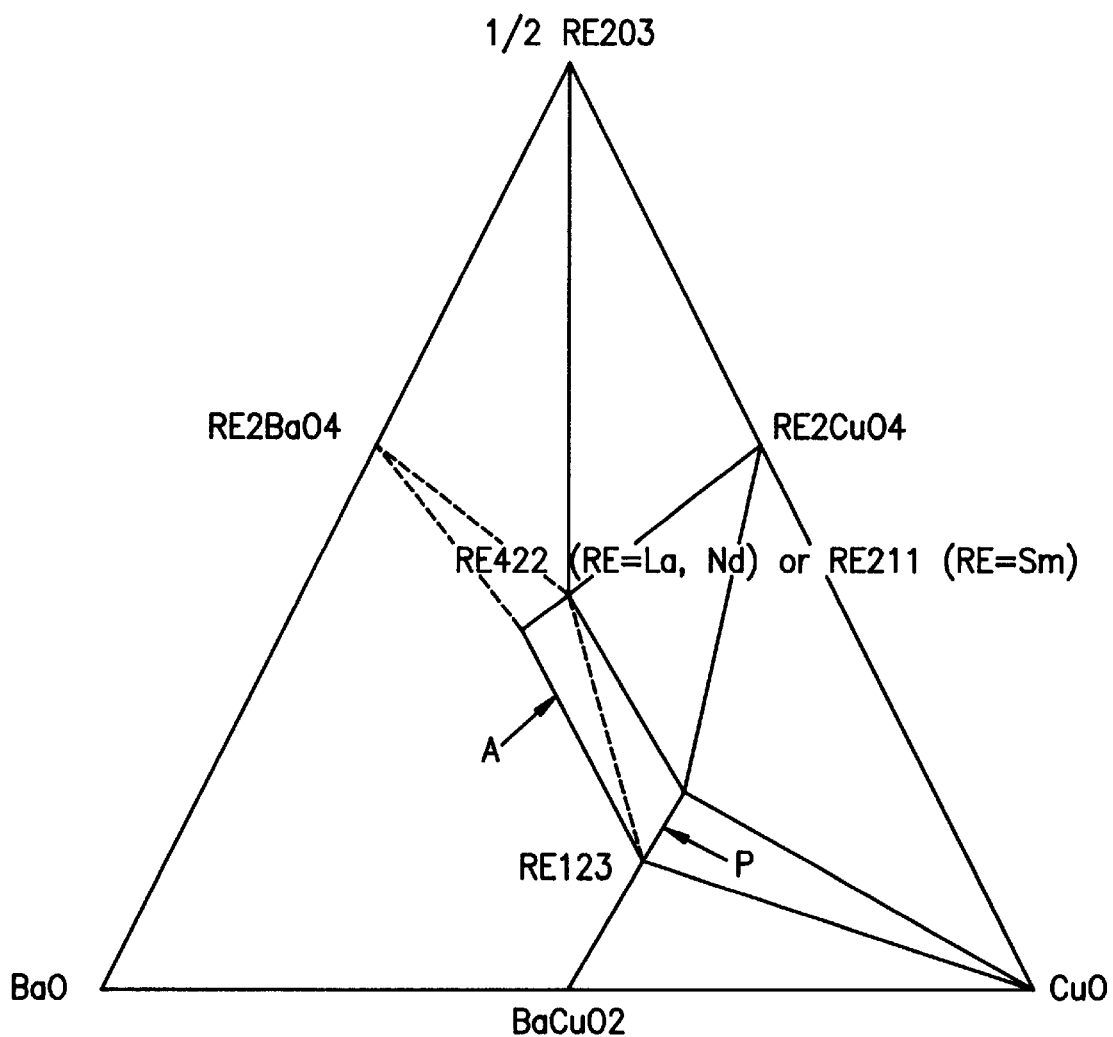
FIG. 1 is a ternary phase diagram of a $RE_2O_3$—BaO—CuO system, in which RE represents a rare earth element having a large ionic radius.

The superconductor according to the present invention includes a matrix phase of RE123 and dispersed phase of RE rich RE123 and Ba rich RE422. The matrix phase is generally present in an amount of at least 30% by volume, preferably at least 50% by volume. The RE rich RE123 dispersed phase is generally present in an amount of 5–20% by volume, preferably 5–15% by volume. The Ba rich RE422 dispersed phase is generally present in an amount of 5–50% by volume, preferably 5–40% by volume.

The RE rich RE123 dispersed phase is in the form of a multiplicity of particles preferably having a diameter of 1 nm to 1,000 nm, more preferably 10 nm to 100 nm, while the Ba rich RE422 dispersed phase is in the form of a multiplicity of particles preferably having a diameter of not greater than 5 $\mu$m, more preferably 1 nm to 1,000 nm. The diameter of the above particles is determined on the assumption that the particles are spherical.

The superconductor according to the present invention may be produced by a process in which a mixture having a temperature of 1,000°–1,300° C. and containing a major molar amount of $RE^1Ba_2Cu_3O_p$ wherein $RE^1$ stands for at least one element selected from the group consisting of La, Nd, Sm, Eu and Gd and p is a number between 6.8 and 7.2, and a minor molar amount of $RE^3{}_{4-2x}Ba_{2+2x}Cu_{2-x}O_{10-y}$ wherein $RE^3$ stands for at least one element selected from the group consisting of La and Nd, x is a number not smaller than 0.1 but not greater than 0.25 and y is a number greater than 0 but smaller than 0.5 is cooled at a cooling rate of 10° C./hour or less.

Any known melt processed method may be adopted for the purpose of the present invention so long as crystals are grown from a melt by peritectic reaction. However, it is important that the mixture should have a temperature of 1,000° C. to 1,300° C. so that the mixture is initially in the form of a partial melt containing a liquid phase of RE123 and a solid phase of Ba rich RE422. When the temperature is outside the above range, it is difficult to maintain the mixture in the form of a partial melt. Further, when the temperature exceeds 1,300° C., the partial melt tends to react with a supporting member, such as a vessel, in which the partial melt is received.

The cooling rate should not be greater than 10° C. per hour since otherwise it is difficult to grow the crystal in a stable manner. Whilst it is preferred that the cooling rate be as slow as possible, a cooling rate of less than about 0.1° C. per hour is actually difficult to perform using currently available crystal growth apparatuses. It is preferred that the cooling of the melt be performed while maintaining a temperature gradient of 5° C./cm or more in a direction along which the crystal grows. Whilst it is preferred that the temperature gradient be as great as possible, a temperature gradient of more than about 100° C./cm is actually difficult to use with currently available crystal growth apparatuses.

The raw material mixture comprises a major molar % of RE123 and a minor molar % of Ba-rich RE422. It is preferred that the raw material mixture contain platinum powder or $CeO_2$ powder having a particle size of 0.5–2 $\mu$m in an amount of no more than about 1% by weight based on the total weight of the RE123 and Ba-rich RE422 for reasons of reducing the particle size of the Ba rich RE422 dispersed phase of the superconductor product. The raw material RE123 and Ba-rich RE422 may be obtained by any known method. For example, Ba rich RE422 may be prepared by calcining a mixture of raw material powders of a RE-containing compound, Ba-containing compound and a Cu-containing compound having a nominal composition corresponding to the Ba-rich RE422.

Because the partial melt containing RE123 and Ba-rich RE422 is not fluid but maintains its original shape, it is possible to prepare a semiconductor having a desired shape. For example, when a raw material mixture containing RE123 and Ba-rich RE422 is previously shaped into a cylinder and when the cylinder is heated to 1,000°–1,300° C., the resulting partial melt keeps its cylindrical shape so that a cylindrical superconductor can be obtained by cooling the partial melt.

It is preferred that the cooling step be followed by annealing in an atmosphere of oxygen. The annealing is generally performed at a temperature of 250°–600° C. for a period of 10 hours to 14 days.

The following examples will further illustrate the present invention.

Preparation of Superconductors

EXAMPLE 1

Raw powders of $Nd_2O_3$, $BaCO_3$ and $CuO$ were weighed to have a nominal composition of Nd:Ba:Cu of 3.8:2.2:1.9. The raw powders were mixed well and calcined at 1,000° C. Such mixing and calcination operations were repeated three times. Finally, the powders were sintered at 1,100° C. to obtain a precalcined $Nd_{3.8}Ba_{2.2}Cu_{1.9}O_y$. Powders of precalcined $NdBa_2Cu_3O_x$ and $Nd_{3.8}Ba_{2.2}Cu_{1.9}O_y$ were mixed with each other with a molar ratio of 8:2. The mixture was shaped into pellets with a uniaxial press and a cold isostatic press and heated in a $ZrO_2$ crucible at 1,120° C. for 30 minutes in air. The partial melt in the crucible was then cooled to 1,080° C. in 8 minutes and gradually cooled to 1,010° C. at a rate of 1° C./hour. This was further treated at 300° C. for 200 hours under an oxygen pressure of 1 atm to obtain a Nd—Ba—Cu—O superconductor according to the present invention.

COMPARATIVE EXAMPLE 1

For the purpose of comparison, Example 1 was repeated in the same manner except that $Nd_4Ba_2Cu_2O_y$ was substituted for $Nd_{3.8}Ba_{2.2}Cu_{1.9}O_y$ to obtain a Nd—Ba—Cu—O superconductor.

Figure 2:
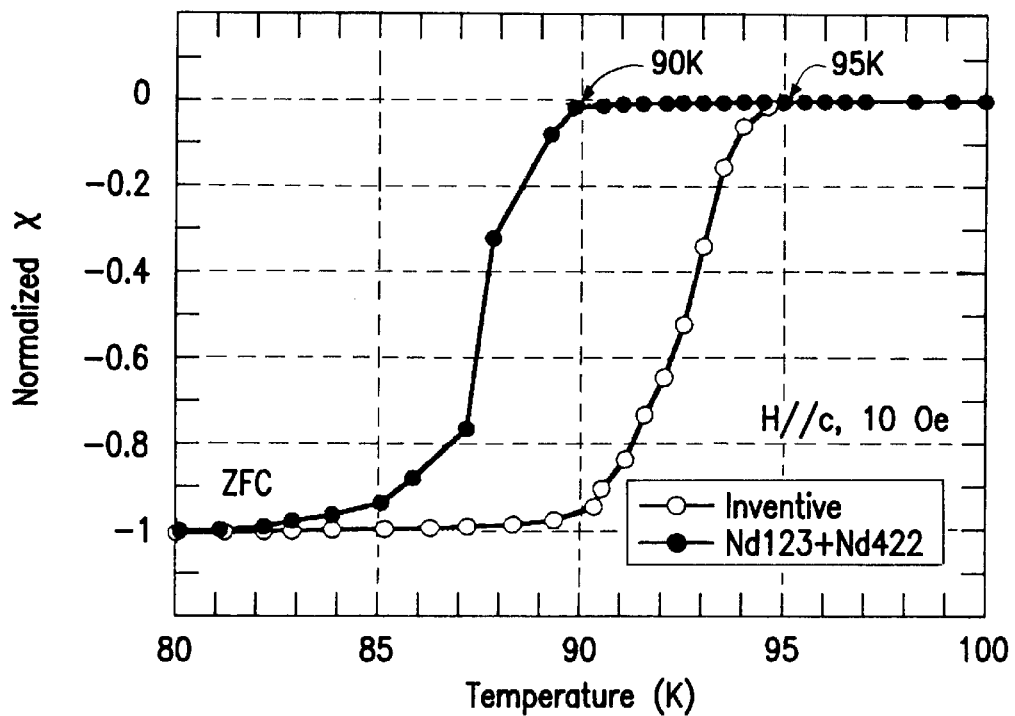
FIG. 2 is a graph showing a relationship between the magnetization and the temperature of a superconductor according to the present invention (white circles) and of a known superconductor (black circles)

Characteristics of Superconductors:

FIG. 2 shows temperature dependence of the magnetization of the above Nd—Ba—Cu—O superconductors. As will be appreciated from the result of FIG. 2, the superconducting transition occurs at a surprisingly higher temperature (95K) in the case of the superconductor obtained in Example 1 (plots of white circles) as compared with the known superconductor obtained in Comparative Example 1 (plots of black circles; 90K). Additionally, the temperature range in which the superconducting transition occurs is narrow in the case of the present invention.

Figure 3:
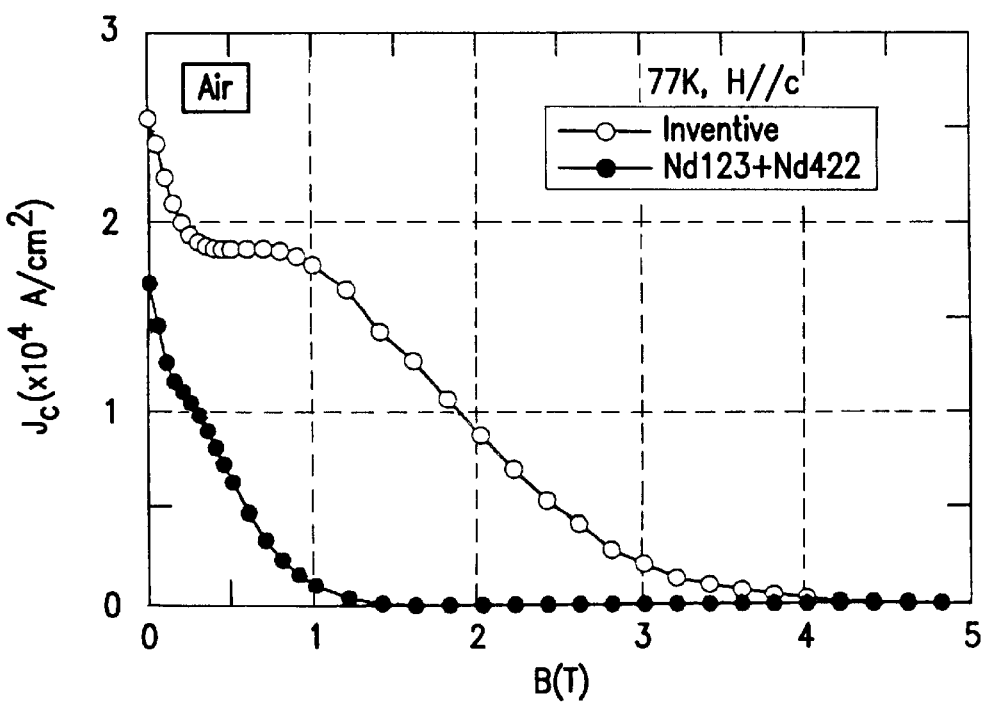
FIG. 3 is a graph showing a relationship between the critical current density and the magnetic filed of a superconductor according to the present invention (white circles) and of a known superconductor (black circles)

FIG. 3 shows the magnetic field dependence of the critical current density of the above superconductors. In the case of the superconductor obtained in Example 1 (white circles), a peak effect is observed. Further, a high current density is obtained in a high magnetic field. This suggests the presence of pinning points which acts in a high magnetic field.

It is known that oxygen deficient regions in a Y—Ba—Cu—O superconductor serve as pinning centers. In this case, however, the pinning effect greatly depends upon the annealing conditions, especially the oxygen partial pressure. In contradistinction, no such changes are observed in the case of the superconductor according to the present invention. This indicates that the pinning effect in the present invention is not attributed to oxygen deficiency.

The elemental analysis of the superconductor of the present invention revealed that the matrix thereof had a composition $NdBa_2Cu_3O_{6.8-7.2}$.

Preparation of Superconductors

EXAMPLE 2

Example 1 was repeated in the same manner as described except that $Nd_{3.6}Ba_{2.4}Cu_{1.8}O_y$ was substituted for $Nd_{3.8}Ba_{2.21}Cu_{1.9}O_y$ to obtain a Nd—Ba—Cu—O superconductor according to the present invention having superconducting characteristics similar to those of Example 1.

EXAMPLE 3

Example 1 was repeated in the same manner as described except that $Nd_{3.5}Ba_{2.5}Cu_{1.74}O_y$ was substituted for $Nd_{3.8}Ba_{2.2}Cu_{1.9}O_y$ to obtain a Nd—Ba—Cu—O superconductor according to the present invention having superconducting characteristics similar to those of Example 1.

EXAMPLES 4–6

Example 1 was repeated in the same manner as described except that the molar ratio of $NdBa_2Cu_3O_x$ to $Nd_{3.8}Ba_{2.2}Cu_{1.9}O_y$ was changed to 9:1 (Example 4), 7:3 (Example 5) and 6:4 (Example 6) to obtain Nd—Ba—Cu—O superconductors according to the present invention having superconducting characteristics similar to those of Example 1. In the case of the superconductor obtained in Example 6, the mechanical strength was found to be higher by about 30% than that in Comparative Example 1.

EXAMPLES 7–10

Examples 1 and 4–6 were each repeated in the same manner as described except that the partial melt additionally contains 0.5% by weight of platinum powder having a particle diameter of about 1 μm to obtain Nd—Ba—Cu—O superconductors according to the present invention which had increased critical current densities at a low magnetic field.

EXAMPLE 11

Precalcined powders of $NdBa_2Cu_3O_x$ and $Nd_{3.7}Ba_{2.3}Cu_{1.85}O_y$ were mixed with each other with a molar ratio of 9:1. The mixture was shaped into pellets with a uniaxial press and a cold isostatic press and heated in a $ZrO_2$ crucible at 1,060° C. for 30 minutes under an oxygen partial pressure of 0.001 atm. The partial melt in the crucible was then cooled to 1,020° C. in 8 minutes and gradually cooled to 950° C. at a rate of 1° C./hour. This was further treated at 300° C. for 200 hours under an oxygen pressure of 1 atm to obtain a Nd—Ba—Cu—O superconductor according to the present invention.

EXAMPLE 12

Example 11 was repeated in the same manner as described except that the molar ratio of $NdBa_2Cu_3O_x$ to $Nd_{3.7}Ba_{2.3}Cu_{1.85}O_y$ was changed to 6:4.

COMPARATIVE EXAMPLES 2–5

For the purpose of comparison, Example 1 was repeated in the same manner except that $Nd_4Ba_2Cu_2O_y$ was substituted for $Nd_{3.7}Ba_{2.3}Cu_{1.85}O_y$ and that the molar ratio of $NdBa_2Cu_3O_x$ to $Nd_4Ba_2Cu_2O_y$ was 9:1 (Comparative Example 2), 8:2 (Comparative Example 3), 7:3 (Comparative Example 4) or 6:4 (Comparative Example 5) to obtain Nd—Ba—Cu—O superconductors.

Figure 4:
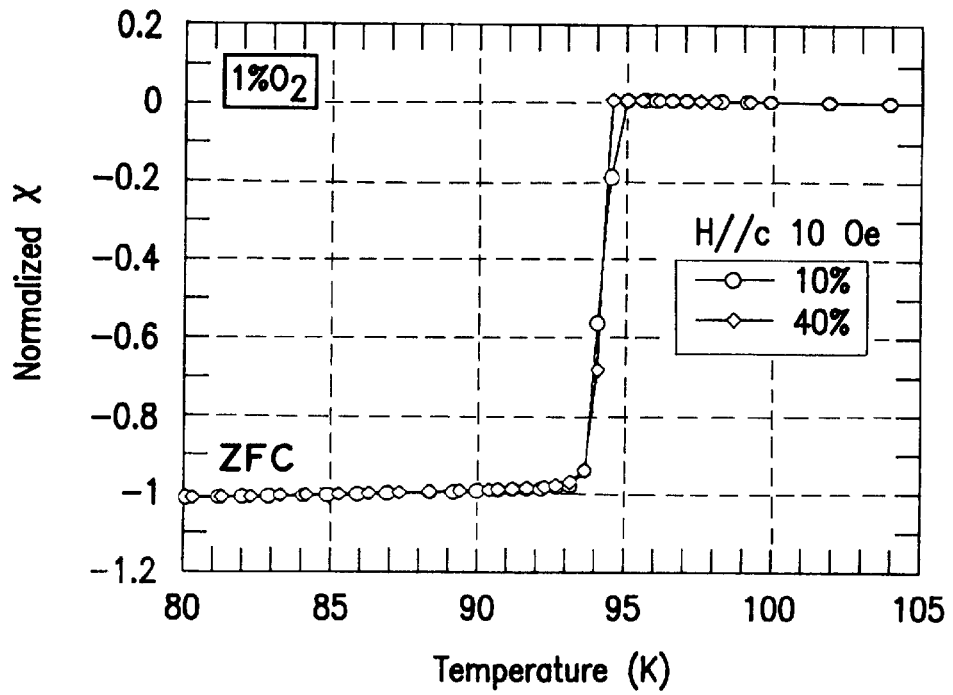
FIG. 4 is a graph showing a relationship between the magnetization and the temperature of a superconductor according to the present invention.

Characteristics of Superconductors:

FIG. 4 shows temperature dependence of the magnetization of the Nd—Ba—Cu—O superconductors obtained in Examples 11 and 12. As will be appreciated from the result of FIG. 4, the superconducting transition occurs at a temperature of above 94K in both of the superconductors obtained in Example 11 (plots of white circles) and in Example 12 (plots of white squares). Additionally, the temperature range in which the superconducting transition occurs is narrow in the case of the present invention.

Figure 5:
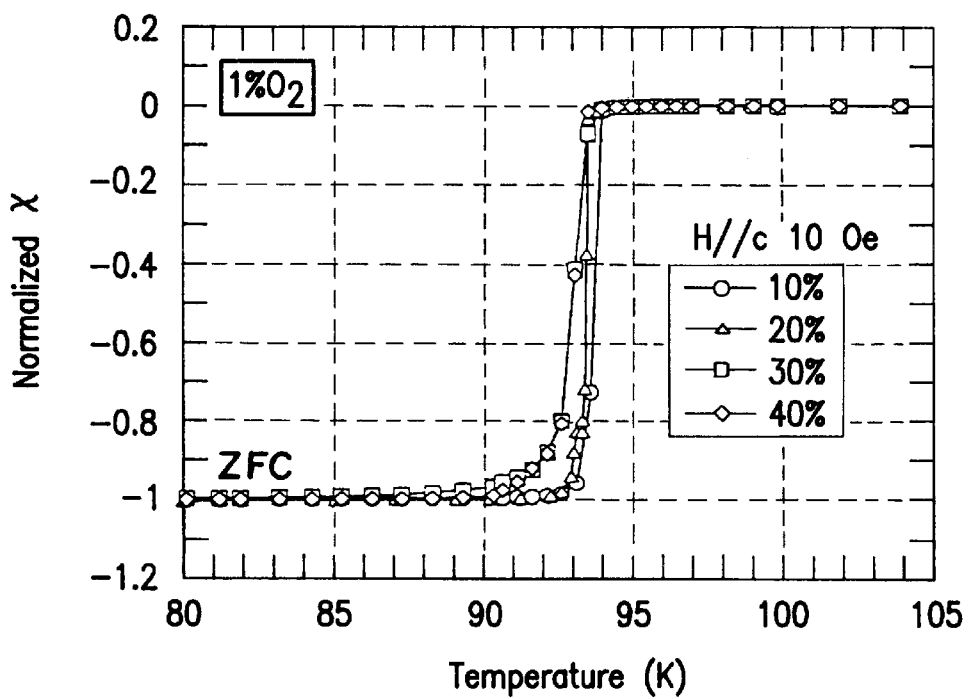
FIG. 5 is a graph showing a relationship between the magnetization and the temperature of a known superconductor.

In contrast, as shown in FIG. 5, the superconductive critical temperature decreases as an increase of the amount of $Nd_4Ba_2Cu_2O_y$ and that the temperature range in which the superconducting transition occurs is broad in the case of the comparative samples.

Further, in the case of the superconductor obtained in Example 12, the mechanical strength was found to be higher by about 30% than that in Comparative Example 5.

Preparation of Superconductors

EXAMPLE 13

Example 11 was repeated in the same manner as described except that $Nd_{3.6}Ba_{2.4}Cu_{1.8}O_y$ was substituted for $Nd_{3.7}Ba_{2.3}Cu_{1.85}O_y$ to obtain a Nd—Ba—Cu—O superconductor according to the present invention having superconducting characteristics similar to those of Example 11.

EXAMPLE 14

Example 11 was repeated in the same manner as described except that $Nd_{3.5}Ba_{2.5}Cu_{1.75}O_y$ was substituted for $Nd_{3.7}Ba_{2.3}Cu_{1.85}O_y$ to obtain a Nd—Ba—Cu—O superconductor according to the present invention having superconducting characteristics similar to those of Example 11.

EXAMPLES 15 and 16

Examples 11 and 12 were each repeated in the same manner as described except that the partial melt additionally contains 0.5% by weight of platinum powder having a particle diameter of about 1 μm to obtain Nd—Ba—Cu—O superconductors according to the present invention which had increased critical current densities at a low magnetic field.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A process for the production of a superconductor, comprising heating a mixture to a temperature of 1,000°–1,300° C. said mixture containing a major molar amount of $RE^1Ba_2Cu_3O_p$ wherein $RE^1$ stands for at least one element selected from the group consisting of La, Nd, Sm, Eu and Gd and p is a number between 6.8 and 7.2 and a minor molar amount of $RE^3{}_{4-2x}Ba_{2+2x}Cu_{2-x}O_{10-y}$ wherein $RE^3$ stands for at least one element selected from the group consisting of La and Nd, x is a number greater than 0 but not greater than 0.25 and y is a number not smaller than 0 but smaller than 0.5 and subsequently cooling said mixture at a cooling rate of 10° C./hour or less, thereby to form a superconducting phase.

2. A process as claimed in claim 1, wherein said cooling is performed under a partial pressure of oxygen of at least 0.1 atm.

3. A process as claimed in claim 1, wherein said cooling is performed at a cooling rate of 5° C./hour or less.

4. A process as claimed in claim 1, wherein said cooling is performed under a partial pressure of oxygen of not lower than 0.00001 atm but lower than 0.1 atm and wherein x is a number greater than 0.1 but not greater than 0.25.

5. A process as claimed in claim 1, wherein said melt contains powder of a component selected from the group consisting of platinum and $CeO_2$ in an amout of not more than 1% based on the total weight of said $RE^1Ba_2Cu_3O_p$ and said $RE^3{}_{4-2x}Ba_{2+2x}Cu_{2-x}O_{10-y}$.

* * * * *

UNITED STATES PATENT AND TRADEMARK OFFICE
CERTIFICATE OF CORRECTION

PATENT NO. : 5,968,878
DATED : October 19, 1999
INVENTOR(S) : KOJO et al

It is certified that error appears in the above-identified patent and that said Letters Patent is hereby corrected as shown below:

On title page, Item [75]

Inventors:", "Yoo, Kokubunji" should read --Yoo, Tokyo--.

Item [57], Abstract line 9, "RE" should read --$RE^3$--.

Col. 5, line 61, "$Ba_{2.21 Cu1.9}$" should read --$Ba_{2.2}Cu_{1.9}$--; and
line 66, "$Cu_{1.74}$" should read --$Cu_{1.75}$--.

Col. 8, line 16, "0.5 and" should read --0.5; and--.

Signed and Sealed this

Twelfth Day of December, 2000

Q. TODD DICKINSON

*Attest:*

*Attesting Officer*   *Director of Patents and Trademarks*